United States Patent [19]

Machida

[11] Patent Number: 4,802,109

[45] Date of Patent: Jan. 31, 1989

[54] DATA-PROCESSING SYSTEM FOR OBTAINING EXPANDED AND INTERPOLATED DATA

[75] Inventor: Yoshio Machida, Tochigi, Japan

[73] Assignee: Kabushiki Kaisha Toshiba, Kawasaki, Japan

[21] Appl. No.: 26,878

[22] Filed: Mar. 17, 1987

[30] Foreign Application Priority Data

Mar. 18, 1986 [JP] Japan .................. 61-59869

[51] Int. Cl.$^4$ .............................................. G06F 7/38
[52] U.S. Cl. ...................................................... 364/723
[58] Field of Search ................ 364/723, 715; 375/26; 382/47, 52; 340/728

[56] References Cited

U.S. PATENT DOCUMENTS

| | | | |
|---|---|---|---|
| 4,428,059 | 1/1984 | Gessert | 364/577 |
| 4,528,639 | 7/1985 | Edwards | 364/723 |
| 4,718,030 | 1/1988 | Tsutsumi | 364/721 |

*Primary Examiner*—Gary V. Harkcom
*Assistant Examiner*—Tan V. Mai
*Attorney, Agent, or Firm*—Foley & Lardner, Schwartz, Jeffery, Schwaab, Mack, Blumenthal & Evans

[57] ABSTRACT

A data-processing system is adapted to obtain data comprised of discrete data having a density different from raw data comprised of discrete data, through the interpolation. The system performs a convolution interpolation so that the noise components of the data may have a substantially uniform variance. The interpolation is performed through a coefficient calculating section and sum-of-products calculating section. The coefficient calculating section calculates the weighting coefficient of the data points of the raw data through the substitution, into a respective predetermined function, of a displacement of the data point of the raw data in the neighborhood of a respective data point of the processed data relative to the data point of the processed data. The sum-of-products calculating section performs a sum-of-products calculation of the coefficients and raw data to obtain a value of the aforementioned data.

8 Claims, 4 Drawing Sheets

F I G. 1
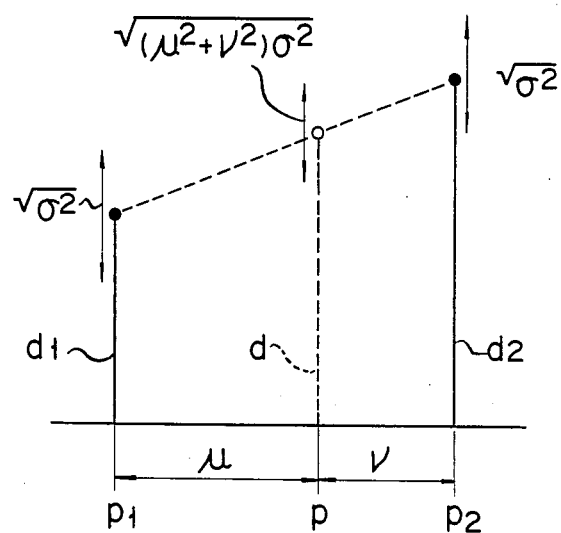
F I G. 2
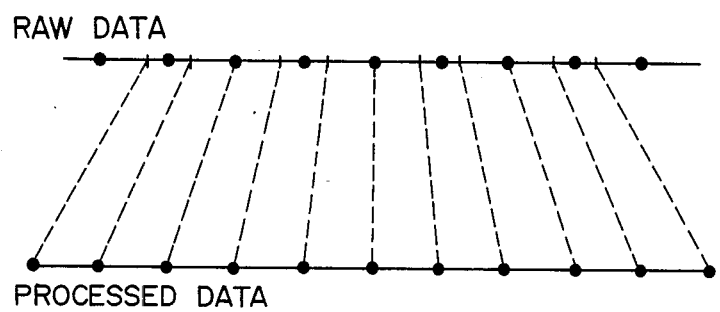

DATA-PROCESSING SYSTEM FOR OBTAINING EXPANDED AND INTERPOLATED DATA

BACKGROUND OF THE INVENTION

This invention relates to a data-processing system for processing discrete data, such as digital image data, and, in particular, to a data-processing system which processes raw data to obtain data comprised of discrete data having a density different from the raw data, through the data interpolation at the time of, for example, an image enlarging processing.

Consideration will now be given to the process for interpolating and enlarging digital image data in a two-dimensional array.

In the conventional data-processing system it is common to subject data to a linear interpolation processing as in the image enlarging processing.

The linear interpolation processing is the procedure for determining interpolation data on an intermediate data point between or among data points in accordance with the geometric array of one raw data relative to one or a plurality of data adjacent to the raw data, assuming that various data are distributed in a linearly varying fashion between the data points of the raw data. That is, with values y1 and y2 known for two data points x1 and x2 use is made of an expression:

$$y = y1 + (y2-y1)(x-x1)/(x2-x1)$$

an approximation of the value y with respect to an arbitrary point x of:

$$x \leqq x \leqq x2$$

In the data-processing system, noise components are normally contained in input data, i.e., raw data. With the linear interpolation so performed, the ratio of the noise components in the processed data depends upon the data position, and is not uniform. As a result, due to the nonuniform distribution of noise components in the processed data and hence a regular distribution obtained with respect to the data position, artifacts occur in the output image data emerged.

This will be explained below in connection with FIGS. 1 to 3.

For convenience in explanation, the interpolation processing of an interpolation ratio $\mu$ is here referred to as an interpolation processing whereby data d is prepared, as a $\mu:\nu$ ratio ($\mu + \nu = 1$), on an interior division point p between data points p1 and p2 of raw data d1 and d2. Raw data usually contains noises and, in this case, the noise of interpolated data (processed data) obtained through the linear interpolation is assumed to be of a normally distributed noise for a variance $\sigma^2$. In this case, the interpolated data (processed data) d obtained through the linear interpolation is considered as having a variance $(\mu^2+\nu^2)\sigma^2$. Since the variance as defined above can be expressed as the square root of the variance, if the variance of the noise of raw data d1, d2 is assumed to be $\sqrt{\sigma^2}$, then the noise at the data d which is obtained from raw data d1 and d2 through the linear interpolation becomes $\sqrt{(\mu^2+\nu^2)\sigma^2}$, which is $\sqrt{\mu^2+\nu^2}$ time the raw data.

Here, when in general the interpolation ratio at the time of an enlarging interpolation processing varies depending upon the data position, the data (processed data) after interpolation has a dispersion in accordance with the variance $(\mu^2+\nu^2)\sigma^2$. As a result, this nonuniform dispersion produces an undesired regular pattern, and thus artifacts are produced on emerging image data in a lattice-like pattern as shown in FIG. 3.

In the conventional data processing system utilizing the linear interpolation, the noise components of the processed data upon an enlarging interpolation has a nonuniform distribution so that artifacts are produced on the output data obtained.

SUMMARY OF THE INVENTION

It is accordingly the object of this invention to provide a data-processing system which can obtain, through an interpolation process, data whose noise components originating from raw data have a substantially uniform distribution.

The data-processing system of this invention is adapted to obtain, through an interpolation of raw data comprised of discrete data, data comprised of discrete data having a density different from the raw data in which case a convolution interpolation is performed through a corresponding processing section so that the processed data may have a substantially uniform distribution. The aforementioned interpolation section includes a coefficient calculating section, and sum-of-products calculating section. The coefficient calculating section calculates weighting coefficients of respective data points of the raw data through the substitution, into a respective predetermined function, of a displacement of the data point of a plurality of the raw data in the neighborhood of the respective data point of the processed data relative to the data points of the processed data. The sum-of-products calculating section obtains the processed data through the sum-of-products calculation of the weighting coefficients and raw data.

Where an interpolation is to be performed from two or three adjacent raw data on coordinate axis on which the discrete data are situated, the aforementioned predetermined function can optimally be expressed by the following risen cosine function RC(x):

$$RC(x) = \begin{cases} (1/3)\{1 + \cos(2/3)\pi x\}, & \text{if } x \in [(-3/2), (3/2)] \\ 0, & \text{otherwise} \end{cases}$$

noting that the aforementioned interpolation is of a convolution type given by the risen cosine function RC(x). In this convolution interpolation, processed data obtained through the interpolation processing emerges as a linear combination of two or three raw data with a respective value, as obtained from the risen cosine function RC(x), as a coefficient.

In the data thus obtained, if the noise distribution of the raw data is of a normal type, the resultant noise variance becomes constant, that is, it never depends upon the displacement of the data points involved. As a result, the processed data is such that the variance or dispersion of the noises becomes constant and thus no artifacts appear on the processed data even if the corresponding image data is subjected to the interpolation processing.

In the data-processing system of this invention, it is possible to obtain processed data, as a result of the interpolation processing, with the noise components, originating from the raw data, substantially uniformly distributed.

BRIEF DESCRIPTION OF THE DRAWINGS

FIG. 1 is a view for explaining a conventional linear interpolation;

FIG. 2 is a view for explaining the concept of an enlarging interpolation processing for image data;

DETAILED DESCRIPTION OF THE PREFERRED EMBODIMENT

The principle, on which the data-processing system according to the embodiment of this invention, will now be explained below.

Figure 3:
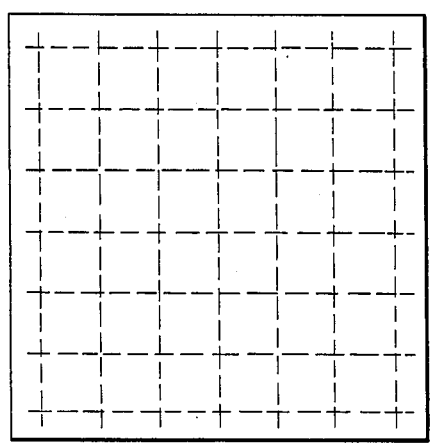
FIG. 3 is a view briefly showing artifacts induced due to the distribution of noise components upon a linear interpolation on image data.
Figure 4:
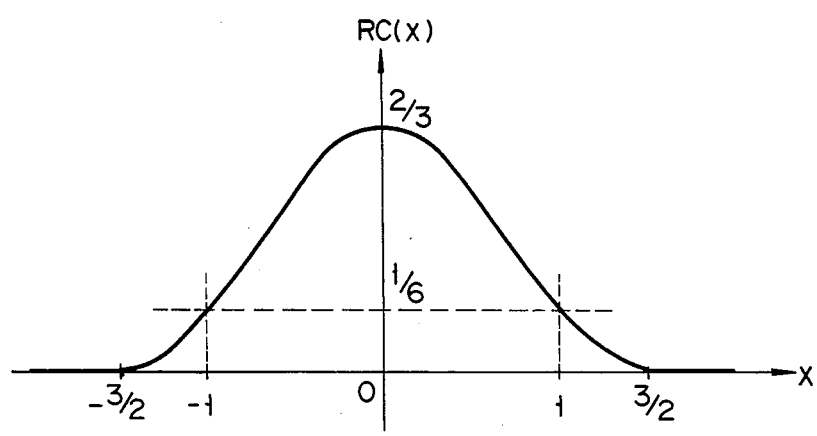
FIG. 4 is a graph showing a curve of a risen cosine function for a data-processing system according to the embodiment of this invention.

The data-processing system of this invention is adapted to obtain data, comprised of discrete data having a density different from raw data, through the interpolation of the raw data comprised of discrete data in which case a convolution interpolation using a risen cosine function is conducted when this interpolation is effected from two or three adjacent raw data on the coordinate axis on which the discrete data are situated. The risen cosine function $RC(x)$ is a function as defined below, showing a portion of a cosine curve as shown in FIG. 4.

$$RC(x) = \begin{cases} (1/3)\{1 + \cos(2/3)\pi x\}, & \text{if } x \in [(-3/2), (3/2)] \\ 0, & \text{otherwise} \end{cases} \quad (1)$$

Figure 5:
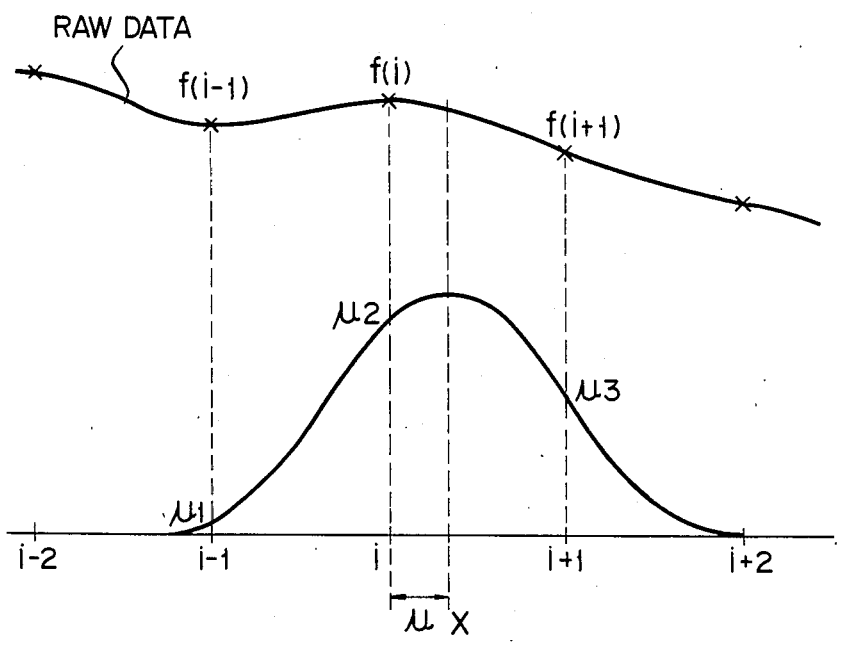
FIG. 5 is a view showing the principle of an interpolation processing on the data-processing system according to one embodiment of this invention.

That is, as shown in FIG. 5, data on data point X ($i-\frac{1}{2}<X<i+\frac{1}{2}$) in the neighborhood of data point $i$ is obtained from raw data $f(i-1)$, $f(i)$ and $f(i+1)$. When processed data of the data points in the neighborhood of the data point $i$ is generated from raw data $f(i-1)$, $f(i)$ and $f(i+1)$ of data points $i-1$, $i$ and $i+1$, the convolution interpolation given by the risen cosine function $RC(x)$ is such that processed data $f(X)$ obtained through the interpolation procedure is expressed by the following equation of a linear combination with $\mu 1$, $\mu 2$ and $\mu 3$ as coefficients $$f(X) = \mu 1 f(i-1) + \mu 2 f(i) + \mu 3 f(i-1) \quad (2)$$

where, $\mu 1 = RC(-\mu - 1)$ $\mu 2 = RC(-\mu)$ $\mu 3 = RC(-\mu + 1) \quad (3)$ and then, the following formula:

$$\mu 1^2 + \mu 2^2 + \mu 3^2 = \text{constant} \ (=\tfrac{1}{2}) \quad (4)$$

can be confirmed by virtue of computation and indicates the variance of the processed data $f(X)$.

If the noise distribution of the raw data is of a normal type, the processed data $f(X)$, obtained through the sum-of-products calculation (a linear combination) of the coefficients $\mu 1$, $\mu 2$ and $\mu 3$ and raw data, is expressed as a variance $\mu 1^2 + \mu 2^2 + \mu 3^2 = \text{constant}$ Consequently, the noise components of the processed data never depend upon the displacement of the data points. It is, therefore, possible to obtain processed data of a constant variance or dispersion, noting that processed data on a data point $i+\frac{1}{2}$ on which the data point X is located is also obtainable from raw data $f(i)$ and $f(i+1)$. In the present system, the data i) obtained through the interpolation process is employed in place of using the raw data (i) as final data on the data point i.

As a result, the data obtained through the interpolation process is uniform in the noise distribution and, even for the image data, no artifacts one produced due to the uniform noise distribution.

The data-processing system according to the embodiment of this invention will now be explained below, while based on the principle, with reference to FIGS. 6 and 7.

Figure 6:
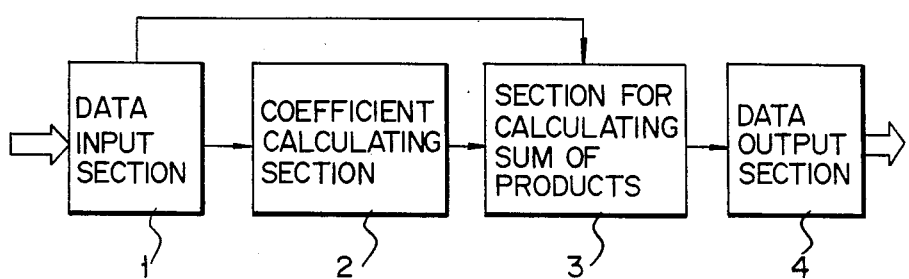
FIG. 6 is a block diagram showing an arrangement of a data-processing system according to the embodiment of this invention.
Figure 7:
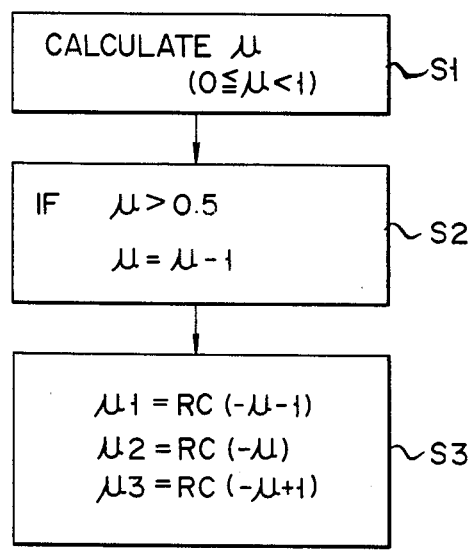
FIG. 7 is a flowchart showing a detail of a coefficient calculating section of the system of FIG. 6.

The data-processing system according to the embodiment of this invention includes data input section 1, coefficient calculating section 2, sum-of-products calculating section 3 and data output section 4, as shown in FIG. 6. Data input section 1 receives the raw data, comprised of discrete data, and temporarily holds it, noting that it processes the image data from a signal processing unit of a medical image diagnostic apparatus, such as a magnetic resonance imaging system. Data input section 1 delivers the raw data to coefficient calculating section 2. Section 2 calculates the coefficients for interpolation process, i.e., the weighting coefficients of the convolution process, through the utilization of the risen cosine function $RC(x)$, as will be set out in more detail below with reference to FIG. 7. Coefficient calculating section 2 supplies the coefficients to sum-of-products calculating section 3 where the coefficients and raw data from data input section 1 are subjected to a sum-of-products calculation process. As a result, processed data is obtained through the interpolation process. Sum-of-products calculating section 3 delivers the processed data to data output section 4. Section 4 outputs the processed data as interpolated data enlarged, for example, at a predetermined scaling.

The data processing of coefficient calculating section 2 will now be explained below in more detail with reference to FIG. 7.

When data $f(X)$ of the data point X is to be prepared from raw data $f(i-1)$, $f(i)$ and $f(i+1)$ of first, second and third data points $i-1$, $i$ and $i+1$, then an interpolation ratio $\mu$ as shown in FIG. 5 is found at step S1.

At the interpolation ratio $\mu > 0.5$ $(=\tfrac{1}{2})$, $\mu - 1$ is evaluated, the result of which, in turn, is again set as $\mu$ at step S2 in which case the value of $\mu$ never varies at $\mu \leq 0.5$.

Through the use of the value $\mu$ obtained at step S2 the weighting coefficients $\mu 1$, $\mu 2$ and $\mu 3$ are evaluated from Equation (3) at step S3.

The weighting coefficients $\mu_1$, $\mu_2$ and $\mu_3$ obtained at step S3 are supplied to sum-of-products calculating section 3 where these weighting coefficients, together with the raw data $f(i-1)$, $f(i)$ and $f(i+1)$, are subjected to a sum-of-products calculation based on Equation (2)

$$f(X) = \mu_1 f(i-1) + \mu_2 f(i) + \mu_3 f(i+1)$$

to find a solution of the processed data $f(X)$.

If the noises of the input raw data are normally distributed, then the noise variance of the processed data $f(X)$ obtained through the interpolation process never depends upon the data point X, and is given below:

$$\mu_1^2 + \mu_2^2 + \mu_3^2 = \tfrac{1}{2}$$

That is, the processed data $f(X)$ is constant in the variance of the noise components and thus the noise variance of the processed data $f(X)$ becomes constant.

Figure 8:
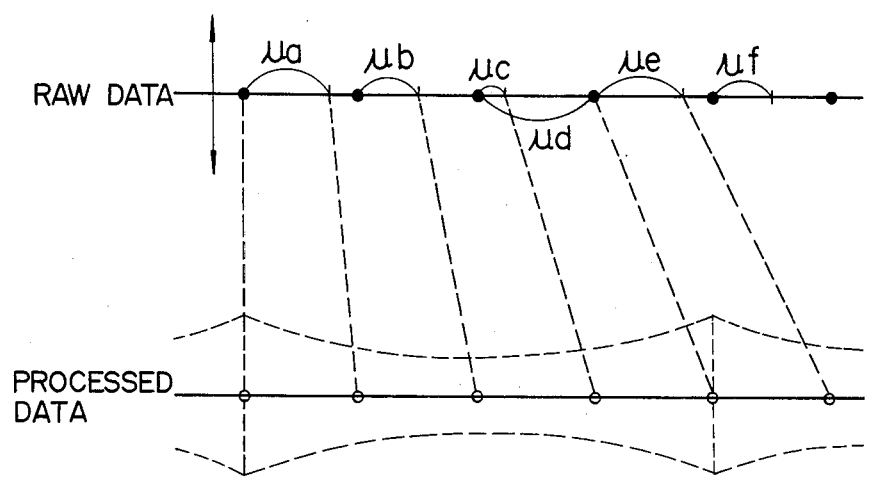
FIG. 8 is a view for explaining the data-processing of the system shown in FIG. 6.

As shown in FIG. 8, for example, when the input data is to be interpolated on an enlarging scale o, such as about 1.38× in FIG. 8, the interpolation ratio varies as $\mu a$, $\mu b$, $\mu c$, $\mu d$, ... In the conventional linear interpolation, a dispersion D occurs in a regular pattern as shown in FIG. 8 with the noise components contained in the processed data, whereas, in the present system, noise components are uniformly distributed.

Even in a two-dimensional image data processing, for example, artifacts never occur on the processed data. Where the two-dimensional data, such as the image data is to be processed, it is only necessary to perform the aforementioned processing for each coordinate axis (a variable).

Although the aforementioned embodiment has been explained as being applied to the one-dimensional data, it is only necessary to repeat the aforementioned process for each coordinate axis (variable) in the application to N-dimensional (two-, three-dimensional, ... ) data.

For the N-dimensional data, the risen cosine function is given below.

$$RCN(t1, t2, \ldots tN) = RC(t1) \times RC(t2) \times \ldots \times RC(tN) \quad (5)$$

If use is made of the risen cosine function RCN, processed data can directly be evaluated, for the N-dimensional raw data, without processing a respective coordinate axis (a variable).

What is claimed is:

1. A data-processing system for obtaining processed data, comprised of discrete data having a density different from raw data comprised of discrete data, through the interpolation of said raw data, which comprises convolution interpolation means including:
   (1) coefficient calculating means for calculating weighting coefficients of respective data points of the raw data through a substitution, into a respective function, of the displacement of the data points of a plurality of said raw data in the neighborhood of respective data point of said processed data relative to the data points of said processed data; and
   (2) sum-of-products calculating means for obtaining a value of said processed data through the sum-of-products calculation of said raw data and said weighting coefficients obtained at the coefficient calculating means, wherein the convolution interpolation is performed so that noise components of said processed data have a substantially uniform variance.

2. The system according to claim 1, wherein said raw data is one-dimensional data and said coefficient calculating means is means for calculating, for two or three raw data in the neighborhood of a data point of said processed data, said weighting coefficients of respective data points of said raw data with the use of a risen cosine function $RC(x)$ defined below:

$$RC(x) = \begin{cases} (1/3)\{1 + \cos(2/3)\pi x\}, & \text{if } x \in [(-3/2), (3/2)] \\ 0, & \text{otherwise.} \end{cases}$$

3. The system according to claim 1, wherein said raw data is two-dimensional coordinate data and said coefficient calculating means is means for calculating, for two or three raw data of the data point of said processed data for every coordinate axis, the weighting coefficients of respective points of said raw data with the use of a risen cosine function $RC(t)$ defined below:

$$RC(t) = \begin{cases} (1/3)\{1 + \cos(2/3)\pi t\}, & \text{if } t \in [(-3/2), (3/2)] \\ 0, & \text{otherwise.} \end{cases}$$

4. The system according to claim 3, wherein said two-dimensional image data is magnetic resonance image data.

5. The system according to claim 3, wherein said two-dimensional image data is magnetic resonance image data.

6. The system according to claim 1, wherein said raw data is two-dimensional coordinate data and said coefficient calculating means is means for calculating, for two or three raw data in the neighborhood of the data point of said processed data for every coordinate axis, the weighting coefficients of the respective data points of said raw data with the use of a risen cosine function $RC2(x,y)$ defined below:

$$RC2(x,y) = RC(x) \times RC(y) \text{ wherein}$$

$$RC(x) = \begin{cases} (1/3)\{1 + \cos(2/3)\pi x\}, & \text{if } x \in [(-3/2), (3/2)] \\ 0, & \text{otherwise} \end{cases}$$

$$RC([t]y) = \begin{cases} (1/3)\{1 + \cos(2/3)\pi[t]y\}, & \text{if } [t]y \in [(-3/2), (3/2)] \\ 0, & \text{otherwise.} \end{cases}$$

7. The system according to claim 1, wherein said raw data is N-dimensional data and said coefficient calculating means is means for calculating, for two or three raw data of the data point of said processed data for every coordinate axis, the weighting coefficients of respective points of said raw data with the use of a risen cosine function $RC(t)$ defined below:

$$RC(t) = \begin{cases} (1/3)\{1 + \cos(2/3)\pi t\}, & \text{if } t \in [(-3/2), (3/2)] \\ 0, & \text{otherwise.} \end{cases}$$

8. The system according to claim 1, wherein said raw data is N-dimensional data and said coefficient calculating means is means for calculating, for two or three raw data in the neighborhood of the data point of said processed data for every variable, the weighting coefficients of the data points of said raw data with the use of a risen cosine function RCN defined below:

$$RCN(t1, t2, \ldots, tN) = RC(t1) \times RC(t2) \times \ldots \times RC(tN)$$

$$RC(t) = \begin{cases} (1/3)\{1 + \cos(2/3)\pi t\}, & \text{if } t \in [(-3/2), (3/2)] \\ 0, & \text{otherwise.} \end{cases}$$

* * * * *